(12) United States Patent
Dennis et al.

(10) Patent No.: US 7,502,422 B2
(45) Date of Patent: Mar. 10, 2009

(54) ELECTROMAGNETIC WAVE TRANSMITTER SYSTEMS, METHODS AND ARTICLES OF MANUFACTURE

(75) Inventors: Anthony Dennis, Belle Mead, NJ (US);
Yongwen Yang, Hillsboro, NJ (US);
Walid Ahmed, Tinton Falls, NJ (US);
Radwan Husseini, Annadale, NJ (US);
David Bengtson, Easton, PA (US)

(73) Assignee: M/A—COM, Inc., Lowell, MA (US)

( * ) Notice: Subject to any disclaimer, the term of this patent is extended or adjusted under 35 U.S.C. 154(b) by 701 days.

(21) Appl. No.: 10/454,697

(22) Filed: Jun. 4, 2003

(65) Prior Publication Data

US 2004/0247040 A1    Dec. 9, 2004

(51) Int. Cl.
*H04L 27/00* (2006.01)
(52) U.S. Cl. .......................... 375/295; 375/376
(58) Field of Classification Search ......... 375/295–320, 375/376, 345, 146, 140, 135, 132, 131, 377, 375/130; 332/105–115, 103
See application file for complete search history.

(56) References Cited

U.S. PATENT DOCUMENTS

| | | | | |
|---|---|---|---|---|
| 4,534,040 A | 8/1985 | Thapar | ........................ | 375/39 |
| 4,580,111 A | 4/1986 | Swanson | ...................... | 332/41 |
| 4,630,315 A | 12/1986 | Watkinson | .................. | 455/109 |
| 4,804,931 A | 2/1989 | Hulick | ...................... | 332/31 R |
| 4,947,455 A | 8/1990 | Swanson | ...................... | 455/115 |
| 4,952,890 A | 8/1990 | Swanson | ...................... | 332/152 |
| 5,268,658 A | 12/1993 | Edwards | ...................... | 332/151 |
| 5,367,272 A | 11/1994 | Hulick | ........................ | 332/149 |
| 5,392,007 A | 2/1995 | Cripe | .......................... | 332/149 |
| 5,450,044 A | 9/1995 | Hulick | ........................ | 332/103 |
| 5,469,127 A | 11/1995 | Hulick et al. | ............... | 332/149 |
| 5,621,351 A | 4/1997 | Puri et al. | ...................... | 330/10 |
| 5,867,071 A | 2/1999 | Chethik | ....................... | 332/103 |
| 5,886,573 A | 3/1999 | Kolanek | ....................... | 350/10 |
| 5,946,402 A * | 8/1999 | Nishio et al. | ................. | 381/103 |
| 6,041,082 A | 3/2000 | Takeda et al. | ............... | 375/300 |
| 6,101,224 A | 8/2000 | Lindoff et al. | .............. | 375/300 |
| 6,130,910 A | 10/2000 | Anderson et al. | ........... | 375/238 |

(Continued)

FOREIGN PATENT DOCUMENTS

CN    1264229 (A)    8/2000

(Continued)

OTHER PUBLICATIONS

Gibilisco, Stan; McGraw Hill Companies, Inc. Handbook of Radio & Wireless Technology; ISBN: 0-07-023024-2; 1999, p. 91.

(Continued)

*Primary Examiner*—Temesghen Ghebretinsae

(57) ABSTRACT

A transmitter comprises a baseband processor, a wideband phase modulator and an amplitude modulated amplifier. A signal is provided through the baseband processor and is converted into polar coordinates, comprised of amplitude and phase components, with the amplitude component being transmitted to the amplitude modulated amplifier. The amplitude modulated amplifier being comprised of independently controllable current sources, and with the phase component being transmitted to the wideband phase modulator, for modulation upon a carrier wave, and subsequent transmission to the amplitude modulated amplifier for amplification according to control imposed by the amplitude component upon the current sources.

30 Claims, 3 Drawing Sheets

U.S. PATENT DOCUMENTS

| | | | | |
|---|---|---|---|---|
| 6,147,553 | A | 11/2000 | Kolanek | 330/10 |
| 6,255,906 | B1 | 7/2001 | Eidson et al. | 330/124 R |
| 6,369,710 | B1 | 4/2002 | Poticny et al. | |
| 6,377,784 | B2 | 4/2002 | McCune | 455/108 |
| 6,411,655 | B1 | 6/2002 | Holden et al. | 375/269 |
| 6,504,498 | B1 * | 1/2003 | O'Brien | 341/143 |
| 6,636,112 | B1 | 10/2003 | McCune | 330/10 |
| 6,658,238 | B1 | 12/2003 | Ursenbach et al. | 455/102 |
| 6,701,134 | B1 | 3/2004 | Epperson | 455/102 |
| 6,738,432 | B2 | 5/2004 | Pehlke et al. | 375/300 |
| 6,756,927 | B2 * | 6/2004 | Hammes et al. | 341/143 |
| 6,791,417 | B2 | 9/2004 | Pengelly et al. | 330/295 |
| 6,799,020 | B1 | 9/2004 | Heidmann et al. | 455/103 |
| 6,816,008 | B2 | 11/2004 | Kontson | 330/51 |
| 6,834,084 | B2 | 12/2004 | Hietala | 375/296 |
| 6,844,788 | B2 | 1/2005 | Chadwick | 332/159 |
| 6,903,619 | B2 | 6/2005 | Dennis et al. | |
| 6,946,884 | B2 * | 9/2005 | Holland et al. | 327/115 |
| 7,072,626 | B2 * | 7/2006 | Hadjichristos | 455/126 |
| 7,269,232 | B2 | 9/2007 | Gagey et al. | |
| 2002/0090921 | A1 | 7/2002 | Midtgaard | 455/126 |
| 2002/0136325 | A1 | 9/2002 | Pehike et al. | |
| 2002/0196864 | A1 | 12/2002 | Booth et al. | 375/296 |
| 2003/0073419 | A1 | 4/2003 | Chadwick | 455/126 |
| 2003/0215025 | A1 | 11/2003 | Hietala | 375/297 |
| 2003/0215026 | A1 | 11/2003 | Hietala | 375/297 |
| 2004/0192369 | A1 | 9/2004 | Nilsson | 455/522 |
| 2004/0198257 | A1 | 10/2004 | Takano et al. | 455/108 |
| 2004/0208157 | A1 * | 10/2004 | Sander et al. | 370/345 |
| 2004/0212445 | A1 | 10/2004 | Haglan | 332/103 |
| 2004/0219891 | A1 | 11/2004 | Hadjichristos | 455/102 |
| 2004/0263245 | A1 | 12/2004 | Winter et al. | 330/10 |
| 2005/0030104 | A1 | 2/2005 | Chen et al. | 330/295 |
| 2005/0064830 | A1 | 3/2005 | Grigore | 455/127.4 |
| 2005/0110565 | A1 | 5/2005 | Robinson | 330/124 R |
| 2005/0110568 | A1 | 5/2005 | Robinson et al. | 330/151 |
| 2005/0122164 | A1 | 6/2005 | Brandt et al. | 330/10 |
| 2005/0134396 | A1 | 6/2005 | Pehlke et al. | 332/103 |

FOREIGN PATENT DOCUMENTS

| | | |
|---|---|---|
| EP | 1056248 | 11/2000 |
| JP | 1319309 | 12/1989 |
| WO | WO 00/74330 | 12/2000 |
| WO | WO 01/76169 A1 | 10/2001 |
| WO | WO 01/97479 | 12/2001 |

OTHER PUBLICATIONS

Rodriguez, J.; Wiechmann, E.; Holtz, J., Suarez, A.; Sepulveda, M.; IGBT Inverter with Vector Modulation; ISBN: 0-7803-1961-3; May 25-27, 1994; pp. 131-136.

* cited by examiner

ELECTROMAGNETIC WAVE TRANSMITTER SYSTEMS, METHODS AND ARTICLES OF MANUFACTURE

FIELD OF THE INVENTION

The present invention relates to the transfer of electromagnetic waves. More particularly, the present invention relates to electromagnetic wave transmitters.

BACKGROUND OF THE INVENTION

Electromagnetic waves may be transferred from place to place through a conductor. In wired transmission, the conductor is usually a wire or other solid substance. In wireless transmission, the conductor is usually an ambient substance, such as air, water, etc. A transmitter typically converts electrical energy into a signal, which is then broadcast via carrier wave through an antenna to a receiver's antenna. Repeaters, middle stations, etc. may be used as intermediates in the transmission to sustain the integrity of the transmitted wave.

The electrical energy input into a transmitter usually results from some intelligence being generated by a sender, such as voice, data, etc. Various digital signal processing techniques are then applied to the information content to provide spectrally efficient transmission. The signal processing techniques can result in signals that have a constant or non-constant envelope characteristic. Constant envelope signals typically use a non-linear transmit line-up while a more linear transmit line-up is typically required for non-constant envelope signals. This signal is then modulated onto a carrier wave by the transmitter. The now modulated carrier wave is the transmitted electromagnetic signal. A receiver may then demodulate the signal, by deconstructing the modulated carrier wave into a copy of the initial intelligence sent by the transmitter.

Various techniques are used to modulate the carrier wave. For example, carrier waves in wireless transmission may be modulated on to signals by varying wave characteristics, such as amplitude, frequency and phase. Modulation may occur through linear or non-linear techniques. Linear techniques typically modulate frequency and/or phase and amplitude characteristics of a non-constant envelope signal. Non-linear techniques typically modulate frequency and/or phase characteristics of a constant envelope signal.

In some areas of signal processing, however, such as radio frequency (RF), linear techniques lead to less than desirable results. For example, linear techniques usually involve linear amplifiers, which can offer relatively precise modulation and therefore transmission. However, the power draw required by linear amplifiers limits their usefulness, especially in portable, battery driven devices.

Attempts have been made in the art to overcome these difficulties. For example, amplifier combining—using multiple amplifiers to amplify the same signal—is one method that attempts to leverage linear and non-linear benefits. However such attempts to date have been constrained by various difficulties. For example, amplifier combining methods use components, such as transformers or quarter wave lines, to sum the output of the amplifiers in order to drive the load. These components add to the cost and size of the amplifier array.

Transmitters may need to support a combination of constant and non-constant envelope pulse processing schemes such as when a transmitter is used for multiple modes of operation (e.g., GSM and EDGE). The need to support multiple pulse processing schemes has led to costly and inefficient architectures. Traditionally, multiple modulation schemes in a single transmitter have been provided through either: single modulation architectures, which provide less than optimal solutions; or, multiple modulation architectures, which increase cost and complexity of the transmitter.

Accordingly, it would be helpful to the art of electromagnetic transmission if non-linear amplification techniques could be used in combination with linear amplification techniques.

It would be further helpful if systems, methods and articles of manufacture could be provided that facilitate multiple modulation schemes in a single transmitter.

SUMMARY OF THE INVENTION

The present invention comprises systems, methods and articles of manufacture for transmitting electromagnetic waves and signals.

In one exemplary embodiment, a transmitter comprises a baseband processor, a wideband phase modulator and an amplitude modulated amplifier; wherein when a signal is provided through the baseband processor, the signal is translated into polar coordinates, comprised of amplitude and phase components, with the amplitude component being transmitted to the amplitude modulated amplifier, comprised of independently controllable current sources, and with the phase component being transmitted to the wideband phase modulator, for modulation upon a carrier wave, and subsequent transmission to the amplitude modulated amplifier for amplification according to control imposed by the amplitude component upon the current sources.

BRIEF DESCRIPTION OF THE DRAWINGS

For the purpose of illustrating the invention, there is shown in the drawings at least one form which is presently preferred; it being understood, however, that this invention is not limited to the precise arrangements, methods and instrumentalities shown.

DETAILED DESCRIPTION OF THE INVENTION

Figure 1:
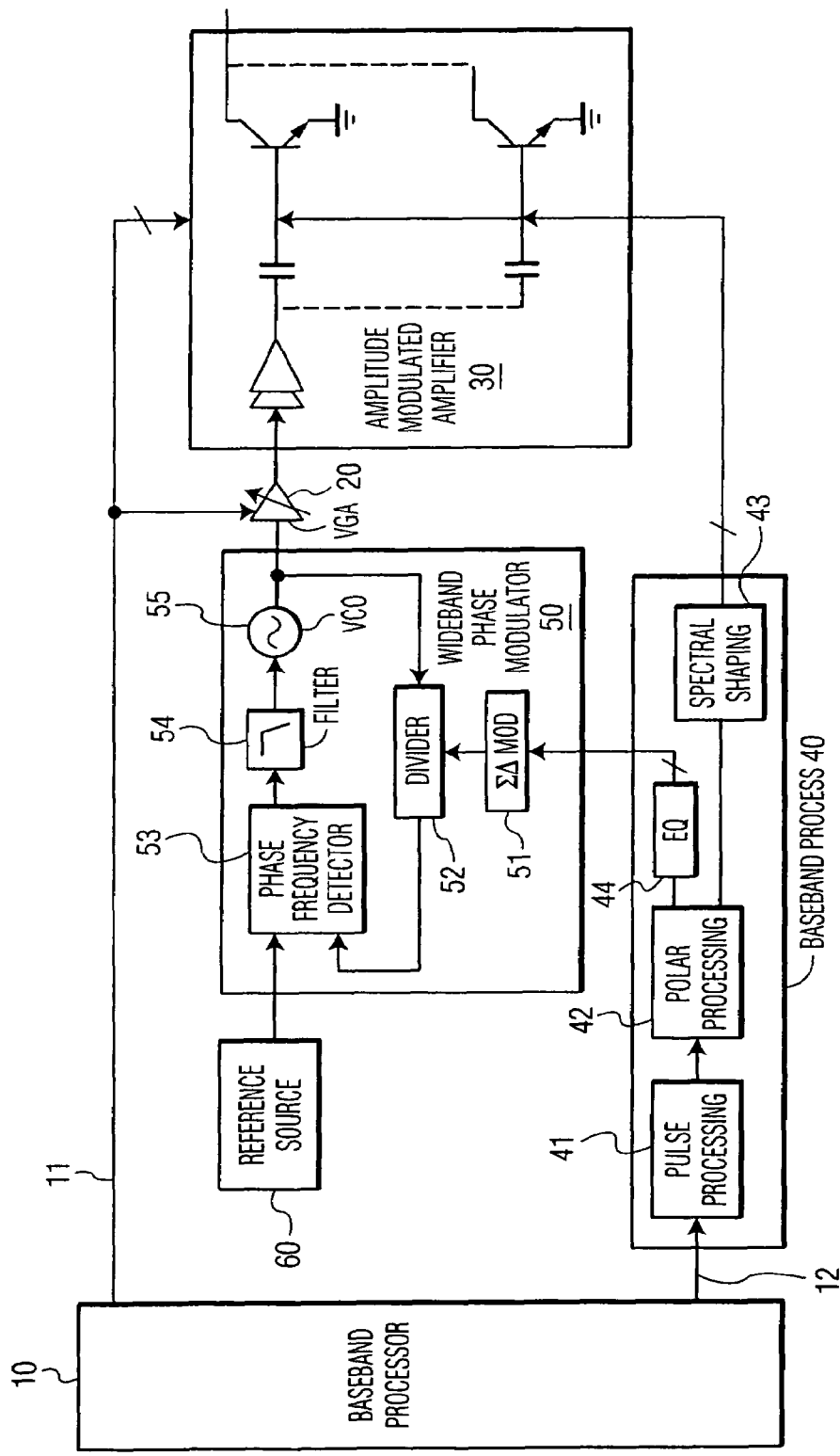
FIG. 1 shows an embodiment of the present invention.

Embodiments of the present invention include apparatus, methods and articles of manufacture for transmitting electromagnetic waves and signals. Embodiments of the invention may be entirely comprised of hardware, software and/or may be a combination of software and hardware. Accordingly, individual blocks and combinations of blocks in the drawings support combinations of means for performing the specified functions and/or combinations of steps for performing the specified functions. Each of the blocks of the drawings, and combinations of blocks of the drawings, may be embodied in many different ways, as is well known to those of skill in the art.

In the especially preferred embodiments, the transmitter is specialized for particular applications, however, combinations of applications may also be desired in a particular embodiments. Applications include but are not limited to: CDMA, CDMA2000, W-CDMA, GSM, TDMA; and, other types of devices, both wired and wireless, e.g. Bluetooth, 802.11a, -b, -g, GPS, radar, 1xRTT, radios, GPRS, computers and computer communication devices, handheld devices, etc.

It should be noted that the word "signal" is used herein to describe an electromagnetic wave that has been modulated in some fashion, usually by the impression of intelligence upon the wave, for example imposing data upon a carrier wave. It should also be noted that the use of "signal" and "wave" in the singular includes the plural (or multiple signals and waves respectively) as often transmitters generate more than one signal and/or wave in the normal course of their operation. It should also be noted that embodiments of the present invention might be used as well to input and/or output waves, as well as signals, as is further described below. It should also be noted that the word "pulse" is used herein to describe components of a signal, so that a signal, for example, is comprised of one or more pulses. Accordingly, signal, pulse, signal processing and pulse processing may be used interchangeably herein.

FIG. 1 shows a preferred embodiment of the present invention. In the preferred embodiments, digital signal processing techniques are combined with analog RF circuits to obtain modulation across multiple modulation techniques, such as GMSK used in GSM, GFSK used in DECT and Bluetooth, 8-PSK used in EDGE, OQPSK and HPSK used in IS-2000, π/4 DQPSK used in TDMA and OFDM used in 802.11.

A Baseband processor 10 provides signals for transmission, e.g. a Baseband Processor 10 is as known in the art, e.g. a digital signal processor and microcontroller. It should be noted that, in other embodiments, other signal providers/receivers may be used, e.g., an analog signal provider, a digital signal provider, etc. and therefore, a Baseband processor may not be used. Additionally, a modified processor, e.g., one without a digital signal processor component, may be used.

In the preferred embodiments, a Power Management module (not shown) is present. The Power Management module dynamically turns on and off various components in the transmitter in order to conserve power. The Power Management module executes its decision to turn on/off a certain component according to various criteria, for example, a predetermined inactivity period, input from external events such as a predefined output power level, gating control signal from Baseband Processor, etc. The Power Management module may control any of a number of other components. For example, a power management operation may turn on/off a Baseband Processor, a PLL, and an Amplitude Modulated Amplifier, in a preferred sequence, when a "transmit gate on/off" signal is issued by the system.

One or more power control signals, based upon the input signal, is passed via a Power Control Interface 11 to Voltage Gain Amplifier 20 (which may be a Variable Gain Attenuator in some embodiments) and Amplitude Modulated Amplifier 30. Power Control Interface 11 may function as a controller in this and other preferred embodiments. For example, if Amplitude Modulated Amplifier 30 comprises one or more biasing stages, such as, for example, three biasing stages, each biasing stage will having an associated control port (not shown here) $s_{c1}$, $s_{c2}$, and $s_{c3}$. In this embodiment, Power Control Interface 11 functions as a controller, and is in communication with control ports $s_{c1}$, $s_{c2}$, and $s_{c3}$ of the three biasing stages. In general, Power Control Interface 11 may be used to regulate each biasing stage to control gain of the Amplitude Modulated Amplifier 30, and output of the amplifier. In other embodiments, power control may be supplied by other means, e.g. Baseband Processor 40 and/or other components contained within the transmitter embodiment.

A signal, which has now been digitized via first Baseband Processor 10, is passed to second Baseband Processor 40 along Baseband Interface 12. (The term "line" may be used interchangeably with "interface" herein, and either term is to be defined as a path for a signal.)

Baseband Processor 40 comprises a Pulse Processing Component 41, Polar Processing component 42, Spectral Shaping Component 43, and Equalizer 44. Pulse Processing Component 41 shapes the data for spectrally efficient transmission, that is, so that there is minimal possible spill over to adjacent frequencies. For example, Pulse Processing Component 41 is implemented, in the preferred embodiments, as a finite impulse response (FIR). Other envelope pulse processing techniques as known in the art may also be used including an infinite impulse response (IIR) filter. The preferred embodiment of an FIR may include a configurable number of taps and programmable filter coefficients to support different digital modulation schemes.

Once the signal has been filtered, it passes to Polar Processing Component 42, which provides translation from rectangular coordinates into polar coordinates with amplitude and phase components. In the especially preferred embodiments, translation is implemented via a coordinate rotation digital computer CORDIC algorithm. In some preferred embodiments, AM/AM and/or AM/PM distortion correction or modification may be implemented here as well, in order to, inter alia, address RF non-linear effects.

The amplitude and phase components are processed through separate paths. The amplitude component passes to Spectral Shaping Component 43, in order to shape the output spectrum as needed, for example, to flexibly support multiple processing schemes, to modify or correct the amplitude component by removing unwanted wideband signal noise, etc. For example, a Spectral Shaping Component may be implemented as a Look Up Table, (LUT) which reconstructs the signal according to entries contained within the table. Other embodiments may use a low-pass filter, such as a FIR, an infinite impulse response (IIR) filter, an analog filter, etc. In the especially preferred embodiments Spectral Shaping Component 43 is implemented as a LUT. From Spectral Shaping Component 43, the amplitude component passes to Amplitude Modulated Amplifier 30, which will be described in further detail below.

Equalizer 44, such as a modulation compensation (equalization) filter provides modulation compensation by having a magnitude and phase response that is the inverse of the closed loop response of Wideband Phase Modulator 50. The bandwidth of Wideband Phase Modulator 50 may need to be limited (e.g. to less than the modulation bandwidth) in order to minimize noise in the output spectrum. Limiting the bandwidth in this manner, however, may attenuate the higher frequency components of the signal. Equalizer 44 compensates for this by increasing the gain of these higher frequency components, thus producing a flat frequency response over the modulation bandwidth of the signal and effectively extending the modulation bandwidth. Equalizer 44 is preferably implemented digitally, and may be either a FIR (finite impulse response) or IIR (infinite frequency response) filter, as examples. Equalizer 44 may also be implemented with programmable coefficients, as desired, or other components as desired. For example, programmable coefficients may provide compensation for any design tolerances of analog components present in Low-Pass Loop Filter 54.

The phase component of the input signal is passed from Equalizer 44 to Wideband Phase Modulator 50 in the embodiment of FIG. 1. Wideband Phase Modulator 50 is comprised of Sigma Delta Modulator (SDM) 51, Divider 52, Phase-Frequency Detector 53, Low-Pass Loop Filter 54 and Voltage Control Oscillator 55.

Reference Source 60 is preferably used to provide a stable phase and frequency reference for the Divider 52 output. Reference Source 60 may be any source of electromagnetic waves that is capable of producing a carrier wave, with a stable phase and frequency reference.

SDM 51 is used to achieve wideband modulation of the phase component of the input signal onto a carrier wave. In this as well as other preferred embodiments, a 3rd Order SDM is used in conjunction with a PLL (comprised of 52, 53, 54 and 55) and Equalizer 44 to achieve wideband modulation and channel selection. SDM 51 pushes out the noise floor where it can be adequately filtered by the low-pass loop filter of the PLL. As noted above, as the achievable bandwidth of the SDM/PLL may be limited to less than the modulation bandwidth to minimize close-in phase noise, a Equalizer is utilized with magnitude and phase response that is the inverse of the closed loop response of the combined PLL and SDM. Thus the modulation bandwidth of Wideband Phase Modulator 50 is extended. SDM may also facilitate close control of the delay variability of the phase signal thus improving system performance.

Returning now to the embodiment of FIG. 1, Sigma-Delta Modulator 51 is preferably comprised of one or more of a series of adders/accumulators and feedback components for inputting the fractional phase/channel number data and outputting a digitized series of integers. SDM 51 is preferably configured in the present embodiment in such a manner that the input range is sufficient for phase data as well as the fractional portion of a channel number. The output frequency of Voltage Control Oscillator 55 is divided by some number, N, which is the divider value of 52. The output of 51 is used to dither the divider value of Divider 52. The dithering of Divider 52 allows for a fractional multiplication factor to be realizable.

Phase-Frequency Detector 53 compares the relative phases of the two signals and outputs a signal that is proportional to the difference between them. This output signal is used to adjust the frequency of Voltage Control Oscillator 55 so that the phase difference measured at the phase detector tracks to zero. Hence, the phase of the signal is locked by the feedback loop to prevent unwanted drift of the signal phase due to variations or distortion in the phase and frequency of Voltage Control Oscillator 55. The output of Voltage Control Oscillator 55 is related to the output of Reference Source 60 by a multiplication factor. The dithering of the Divider 52 allows for a fractional multiplication factor to be realizable. This divider is required due to the relatively high frequency of Reference Source 60 coupled with the small channel resolution requirement of the various industry standards.

A feedback signal from Voltage Control Oscillator 55 is passed through Divider 52. The phase component information received from SDM 51 is used to dither the divider between a range of divider values. The dither of the divider value is the mechanism through which the phase information is modulated onto the carrier. The resulting signal is passed to Phase-Frequency Detector 53, where it is compared with the reference signal from Reference Source 60, as noted above. This comparison result is passed through Low-Pass Loop Filter 54, where it is used to generate the phase-modulated carrier wave signal via Voltage Control Oscillator 55.

The output of Wideband Phase Modulator 50 is thus an electromagnetic wave that has a constant amplitude or envelope characteristic, as well as a frequency or phase characteristic that now varies from its original value in relation to the phase component of the input signal.

This phase modulated carrier wave is then passed to Amplitude Modulated Amplifier 30 to be amplified. Preferably the phase modulated signal is first passed through Variable Gain Attenuator (VGA) 20 to modify some characteristics such as gain and/or frequency response of the signal to meet the dynamic range and emissions requirements in output power for the applicable industry standards. Variable Gain Attenuator 20 may also be replaced by another modifier, (e.g., a Voltage Gain Amplifier) depending on specific power control needs, for example, to modify the gain of the signal to meet dynamic range requirements in output power for various industry standards. Subsequent to the VGA 20, band-pass filtering may be included if desired to further limit wideband noise emissions. There may be, in some embodiments, one or more additional amplifiers associated with Amplitude Modulated Amplifier 30.

Figure 2:
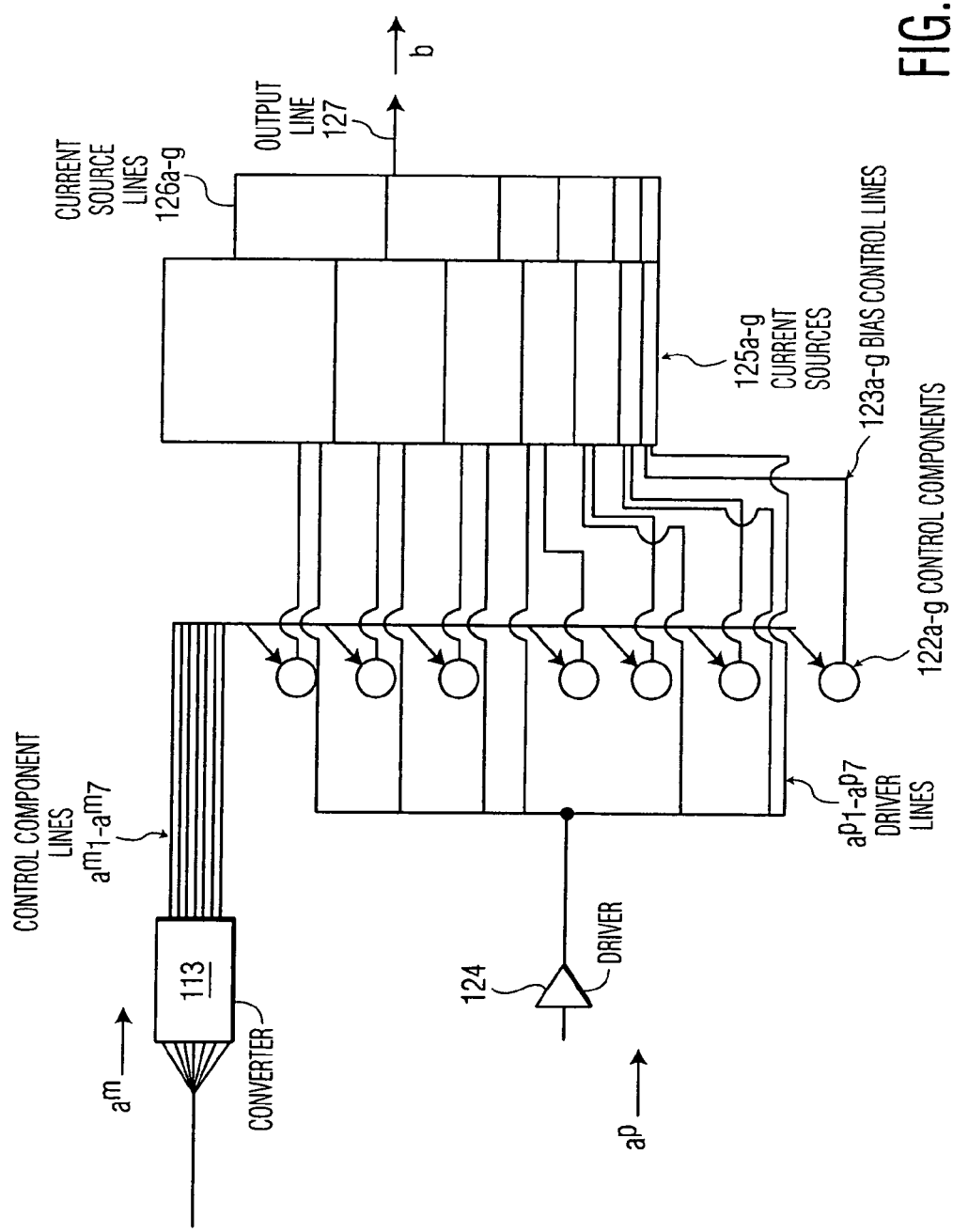
FIG. 2 shows another embodiment of the present invention.

The amplitude portion of the input signal is passed from Baseband Processor 40 to Amplitude Modulated Amplifier 30. Turning briefly to FIG. 2, an Amplitude Modulated Amplifier 30 used in the especially preferred embodiments is shown.

Amplitude Modulated Amplifier 30 modulates the baseband amplitude signal onto an RF carrier through reconstruction of the amplitude signal onto a phase modulated RF carrier. Amplitude Modulated Amplifier 30 is, in this and other preferred embodiments, capable of modulating signals with differing bitwidth resolutions. Pre-distortion factors may be provided as well, if desired, as well as dynamic manipulation of bias controls to vary gain and resulting output power dynamic range.

In the embodiment of FIG. 2, the amplitude portion of the input signal is converted, via converter 113, along path $a^m$, into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input signal. The digital word provides control for attenuation and/or amplification, in manner to be described further below. Of course, as is described further below, in other embodiments, a differently composed digital word may be used, as well as other types of derivation and/or provision of amplitude or other signal characteristics.

Seven control component lines $a^m1$-$a^m7$ are shown leading away from the converter 113. The number of these control component lines depends, in the preferred embodiments, upon the resolution of the word. In this preferred embodiment, the word has a seven bit resolution. It should be noted in FIG. 2 that, for ease of viewing the figure, the control component lines are consolidated into a single path $a^m$ leading into control components 122*a-g*. However, in the embodiment, and as further described below, the control component lines are not consolidated and instead feed into the control components individually. The phase component travels along path $a^p$. This component has a constant envelope, i.e., it has no amplitude variations, yet it has phase characteristics of the original input wave, and passes to driver 124, and in turn driver lines $a^p1$-$a^p7$. The wave, which has been split among the driver lines, is then fed into current sources 125*a*-125*g*, and will serve to potentially drive current sources 125*a*-25*g*, as is further described below.

It should be noted that, in the present embodiment, transistors may be used as current sources 125*a*-125*g*. Additionally, in other embodiments, one or more transistors segmented appropriately may be used as current sources 125*a*-125*g*.

Path $a^m$ (comprised of control component lines $a^m1$-$a^m7$ as described above) terminates in control components 122*a-g*. In the especially preferred embodiment, these are switching transistors, and are preferably current sources. Control components 122*a-g* are switched by bits of the digital word output from the amplitude component and so regulated by the digital word output from the amplitude component. If a bit is "1" or "high," the corresponding control component is switched on, and so current flows from that control component to appropriate current source 125a-g along bias control lines 123a-g. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 125a-g receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Each current source serves as a potential current source, and is capable of generating a current, which is output to current source lines 126a-g respectively. Each current source may or may not act as a current source, and so may or may not generate a current, because it is regulated via the appropriate instruction signal, or digital word value regulating a control component. Activation of any segment, and generation of current from that segment, is dependant upon the value of the appropriate bit from the digital representation of the amplitude component regulating the appropriate control component. It should be noted that the current sources are not an amplifier or amplifiers, in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 125a-g, is the current sources output. Thus the embodiment may act as an attenuator and/or amplifier. In addition, power control may be provided so as to achieve a dynamic range in output power required of various wireless standards. In other preferred embodiments, manipulating the bias controls of any amplification stage(s) may be done to change the gain in the path of the phase modulated carrier as well as the amplitude path.

No further circuitry or components are necessary between current sources to combine current from each current source and so provide a useful output current. Therefore, the combined current, which is output on line 127, and shown as b, may be used as desired, e.g., as an amplifier, as an attenuator, to drive a load, etc.

In the preferred embodiments, the current sources vary in current output and size. This provides various weightings to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources—of the same size—are provided, as well as current sources that vary in size. In yet other embodiments, other wave characteristics may be provided to other current sources and so regulate those sources.

It should be noted that, in the present invention, the current sources are biased non-linearly. Thus, any current source operates efficiently. In the preferred embodiments, therefore, power consumption is reduced. Additionally, as a result of current source regulation according to signal characteristics, as had been described above, the resultant output signal has a relatively accurate linearity and proportionality with the input signal. Thus, an amplifier may be provided in the preferred embodiments with the relative precision of linear operation combined with the relative efficiency and power consumption of non-linear operation.

For example, returning to the embodiment of FIG. 2, if one of current sources 125a-g is switched on, it will act as a non-linear current source with attendant relative efficiency. If the current source is off, the source draws little or no power. Linear characteristics are seen as well because each current source that is on provides current contribution in similar proportions to the amplitude characteristic of the input signal, and so a relatively precise reproduction of the input signal is provided.

The current sources 125a-g comprise, in the preferred embodiment of FIG. 2, one or more HBT transistors. Other transistors may be used as well, such as FETs, etc., as well as other current sources. Other components may be interposed as well, e.g., a variable gain amplifier or attenuator to reduce the drive current to the transistor segments, non-linear components along the amplitude path, etc.

The use of the preferred embodiments may provide a capability for wide band amplitude modification in an associated transmitter. Linear amplification and/or attenuation is provided across a relatively large frequency spectrum. Of course, other embodiments may use different amplifiers in addition to, and/or instead of, the Amplitude Modulated Amplifier shown in FIG. 2.

Returning now to the embodiment of FIG. 1, an output is then produced from Amplitude Modulated Amplifier 30 that represents an amplified carrier wave carrying any intelligence contained within the input signal.

The signal may then pass to a load such as an antenna or to other components. In the especially preferred embodiments where the signal passes to a load, any load line is chosen, as is known in the art, to provide an impedance match for a load. It is important to note however that impedance matching is not necessary between Amplitude Modulated Amplifier 30 and a load, as Amplitude Modulated Amplifier 30 is serving as a current source rather than a power source. Of course, in other embodiments, the signal may undergo further alteration, amplification, modification and/or processing upon being placed on a load or other line leading away from Amplitude Modulated Amplifier 30.

Figure 3:
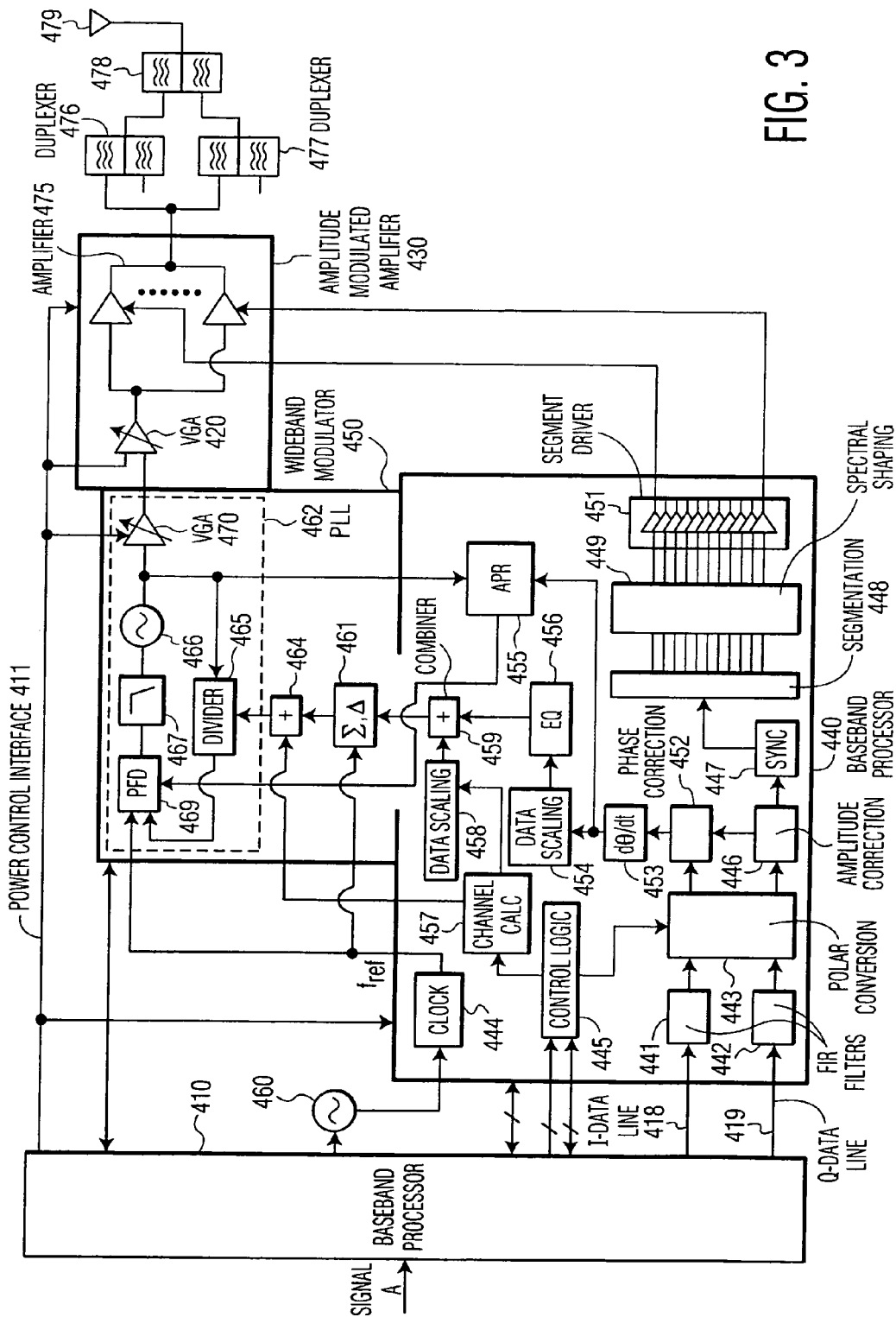
FIG. 3 shows another embodiment of the present invention.

FIG. 3 shows yet another preferred embodiment. A baseband signal a is provided through a first Baseband Processor 410, as is known in the art, e.g. via a digital signal processor and microcontroller. It should be noted that any type of signal provider may be used to provide a signal for the preferred embodiments, e.g., an analog signal provider, a digital signal provider, etc. Depending upon the signal provider, therefore, a first baseband processor will be modified and/or eliminated completely as is known in the art. If signals are supplied via digital conversion, it should be noted that subsequent modification may be implemented through various digital components, as is further described below.

In the preferred embodiments, a Power Management module (not shown) is present. The Power Management module dynamically turns on and off various components in the transmitter in order to conserve power. The Power Management module executes its decision to turn on/off a certain component according to various criteria, for example, a predetermined inactivity period, input from external events such as a predefined output power level, gating control signal from Baseband Processor, etc.

One or more power control signals, based upon the input signal, is passed via a Power Control interface 411 to Variable Gain Attenuator 420 and Amplitude Modulated Amplifier 430. In other embodiments, power control may be supplied by other means, e.g. Baseband Processor 410 and/or other components contained within the transmitter embodiment. In other embodiments, additional or all power control information may be provided via the serial interface from Baseband Processor 410.

If the Amplitude Modulated Amplifier 430 comprises one or more biasing stages, such as, for example, three biasing stages, each biasing stage will having an associated control port (not shown here) $s_{c1}$, $s_{c2}$, and $s_{c3}$. In this embodiment, the Power Control Interface 411 functions as a controller, and is in communication with control ports $s_{c1}$, $s_{c2}$, and $s_{c3}$ of the three biasing stages. In general, Power Control Interface 411 may be used to regulate each biasing stage to control gain of the Amplitude Modulated Amplifier 430, and output of the amplifier. Preferably, Amplitude Modulated Amplifier 430 controls the amount of reference voltage of each biasing stage of the amplifier in the course of processing the amplitude component am and the phase component pm at a rate controlled by control ports $s_{c1}$, $s_{c2}$, and $s_{c3}$, and provides an output signal, e.g. Pout. It should be understood that, in other embodiments, amplifiers may have other than three biasing stages—amplifiers having any number of stages and any number of control ports may also be utilized.

A plurality of transfer characteristics may exist in this embodiment between an input port for the phase component the control ports $s_{c1}$, $s_{c2}$, and $s_{c3}$ and an output port of Amplitude Modulated Amplifier 430. The transfer characteristics may be, for example, voltage, current, power, ACPRn (where n may be any integer value), RHO, phase change, AM/AM or AM/PM characteristics, phase noise, BER, etc. For example, one or more characteristics of output signal Pout, such as voltage, current and/or power, may be represented as a function of one or more of the control signals at control ports $s_{c1}$, $s_{c2}$, and $s_{c3}$. The output signal Pout, therefore, may take the form:

$$f(s_n)=f(s_{c1},s_{c2},s_{c3}) \qquad \text{Equation 1}$$

where $s_{c1}$, $s_{c2}$, $s_{c3}$ represent control signals at control Ports $s_{c1}$, $s_{c2}$, and $s_{c3}$, respectively. The control signals select an operating point on a transfer characteristic curve for a device.

A number of other control lines (which, as noted above, may be interfaces as well) extend from Baseband Processor 410 for general control of various transmit functions as is typical in the art (e.g., general purpose I/O controls; controls for gating various blocks in the transmitter ON/OFF to conserve power; Synthesizer Lock control line for control of the appropriate synthesized signal from Wideband Modulator 450 to indicate the lock status of the PLL and Serial I/F; etc.) I Data Line 418 and Q Data line 419 are provided for I,Q data transmitted to second Baseband Processor 440 as is further described below.

It should also be noted that, in other embodiments, alternative control schemes may be used. For example, if an input device such as an attenuator, whether provided with an amplifier or as a separate device from an amplifier, then a control signal $s_{c0}$ and phase component pm may be input to the attenuator, and attenuator outputs a signal Pin that is then input to the first biasing stage of an amplifier. In general, in these embodiments, control signal $s_{c0}$, in combination with an attenuator, may be used to regulate either one or both of the power level and dynamic range of the signal Pin. So, for example, if the power level of Pin is set, the output signal Pout from the amplifier, therefore, may take the form:

$$f(s_0)=f(s_{c0},s_{c1},\ldots,s_x) \qquad \text{Equation 2}$$

where $s_{c0}$ represents the power-in signal Pin, and $s_{c1},\ldots,s_x$ represent control signals at any control ports. As mentioned above, the control signals and the power-in signal Pin select an operating point on a transfer characteristic curve for a device.

In yet other embodiments, a control system may comprising components such as an attenuator, (e.g. a voltage controlled attenuator); an amplifier with one or more Voltage Gain Amplifier (VGA) stages, as well as a transistor array stage comprised of a plurality of transistors or transistor segments; and a power control interface. In certain of these embodiments, the amplifier may be implemented so as to receive separate amplitude and phase components. For example, the amplitude component may be used to control the various transistors/segments, such as by regulating one or more bias control components connected with the transistors/segments. The bias control components may comprise, for example, switching transistors, which may operate as current sources where desired. The amplitude component may comprise, for example, a digital word received by the bias control components, such that if a bit is "1" or "high", the corresponding bias control component is switched on and current flows to the appropriate transistor/segment.

In these embodiments, the controlling characteristic sent by the controller for each respective control signal is a voltage. A voltage control signal Vpin is received by the attenuator in order to set the power level Pin to the amplifier. The control voltages of any VGA stages may be a regulated voltage Vb12 or, be separate control signals. The control voltage for a transistor array stage may be Vb3. Any of the control voltages may be DC bias control voltages that bias one or more stages of the amplifier, so that the Vb12 and Vb3 voltages impact the biasing circuitry. Another voltage, Vcc, may power the remainder of the circuitry of amplifier. The total average output power Pout of amplifier and the output current associated with Pout can be illustrated by examining the transfer characteristics of the amplifier at various values of Pin, in these embodiments.

Returning now to the embodiment of FIG. 3, when I,Q data is received by Baseband Processor 440, each is filtered using FIR filters 441 and 442 which shape the data for spectrally efficient transmission, that is, so that there is minimal possible spill over to adjacent frequencies. Polar Conversion Block 443 provides translation of the I,Q data into polar coordinates comprising phase and amplitude components, via a CORDIC algorithm. The FIR filters 441 and 442 and/or the I/Q to Polar Conversion Block 443 can be incorporated into the Baseband Block 410. Additionally, FIR filters can be incorporated into the Baseband block and followed by a pair of D/A Converters. In the event that DACs are used after the I/Q FIRs, it should be understood that corresponding A/D Converters can be utilized to provide the necessary sampled I/Q data stream to the Polar Conversion Block 443.

The amplitude and phase components are then processed through separate paths. The amplitude component passes to Amplitude Correction component 446, where it is corrected as desired. For example, a LUT may be employed here to provide absolute values for the amplitude component or values that use a linear approximation of the output from the amplifier and so the amplitude component would be corrected accordingly. Synchronization Adjustment Component 447 then provides any necessary correction to maintain synchronization with the phase component. The amplitude component then passes to Segmentation Component 448, where, via Spectral Shaping Component 449, and Segment Driver Bank 451, it is split in order to control Amplitude Modulated Amplifier 430 as is further described below.

Segmentation component 448 converts the amplitude component of the signal into digital pulses comprising a digital word quantitized into bits $B_0$ to $B_{n-1}$, with a Most Significant Bit ("MSB") to Least Significant Bit ("LSB"). The digital word may be as of varying lengths in various embodiments. In general, the longer the word the greater the accuracy of reproduction of the input wave. The digital word provides control for amplification, in manner to be described further below. Of course, in other embodiments, a differently composed digital word may be used, as well as other types of derivation of amplitude or other wave characteristics.

Segmentation Component 448 then splits the bits, each of which are a time-domain square waveform, onto separate paths 1 to N which travel to Spectral Shaping Component 449, which allows for spectral shaping of the reconstructed I/Q signal to meet applicable wideband noise emission specifications. Spectral Shaping Component 449 is comprised of filters F1 to Fn. The impulse response of filters F1 to Fn is at $h(t)_1$ to $h(t)_N$ respectively which may be determined using various methods. For example, a weighted value of a h(t) for the output signal may be utilized to provide an impulse response for each filter. As another example, a LUT may be implemented that maps the actual amplitude values to a predetermined series of values, such as for example, desired output of segments of Amplitude Modulated Amplifier 430. Once the signal passes through Spectral Shaping Component 449 it is amplified by Segment Driver Bank 451 and passes to Amplitude Modulated Amplifier 430, which will be described in further detail below.

Phase Correction Component 452 corrects the phase component as desired. For example, a LUT may be employed here to provide absolute values for the phase component or values that use a linear approximation of the output from Amplitude Modulated Amplifier 430 and so the phase component would be corrected accordingly. dθ/dt component 453 translates data from a phase representation into a derivative of the phase or frequency representation. This can be done using analog techniques or digital techniques, for example, using continuous time domains (analog) or distinct time domains (digital.)

The signal then passes to Data Scaling Processor 454 and Adaptive Phase Realignment (APR) component 455. Data Scaling Processor 454 scales the gain of the phase component of the signal to be consistent with the desired modulation index. The scaling of the signal may be accomplished through any conventional means. Adaptive Phase Realignment Component 455 ensures the phase component is calibrated appropriately by comparing the original phase component received from dθ/dt 453 with the output from Wideband Modulator 450. Discrepancies in the output are then corrected by providing correction from APR component 455 to phase-frequency detector (PFD) 469. This feedback system operates to maintain the loop in lock and minimize any phase error.

The phase component signal is then passed through Equalizer 456, which is calculated to have a magnitude and phase response that is the inverse of the closed loop response of Wideband Phase Modulator 450. As will be discussed below, in some instances, it may be desired to limit the bandwidth of Wideband Phase Modulator 450 (to be less than the modulation bandwidth) in order to minimize noise in the output spectrum. Limiting the bandwidth in this manner, however, attenuates the higher frequency components of the signal. Equalizer 456 compensates for this by increasing the gain of these higher frequency components, thus producing a flat frequency response over the modulation bandwidth of the signal and effectively extending the modulation bandwidth. Equalizer 456 is preferably implemented digitally, and may be either a FIR (finite impulse response) or IIR (infinite frequency response) filter, as examples.

In order to implement the appropriate frequency for the transmitter, Baseband Control Logic and Memory Component 445 provides the desired frequency to Channel Calculation Component 457. In order to comply with the raster requirements of the applicable industry standards, each signal may be modulated to center around a frequency that is offset from the carrier wave frequency by a certain amount. Each offset center frequency and the frequency bandwidth that surrounds it is designated as a different channel, having a channel number. The center frequency about which a given signal is to be modulated is determined by a Channel Calculation Component 457, by which the reference frequency is multiplied by a number to establish a unique channel for the signal in the overall transmit frequency range.

Channel Calculation component 457 yields a number that has an integer part and a fractional part. The fractional portion of this number, after passing through Data Scaling Processor 458, which scales the gain of the data signal. The fractional signal is then combined with the phase data signal, by Combiner 459, and passed to Sigma Delta Modulator (SDM) 461.

SDM 461 provides wideband modulation of the phase component of the input signal onto a carrier wave, via randomization of the input to an over-sampled output, with the average of the output being equal to the input. SDM 461 may comprise, for example, a series of adders/accumulators and feedback components for inputting the fractional phase/channel number data and outputting a digitized series of integers that equal the fractional input. SDM 461 is preferably configured in the present embodiment in such a manner that the input range is sufficient for phase data as well as the fractional portion of the channel number. In one preferred embodiment, SDM 461 is a three bit system, which is thus capable of producing eight different output numbers, although as should be understood, in other embodiments SDM 461 may comprise any desired number of bits. In the present embodiment, SDM 461 preferably produces four output integers for each sample of the input, yielding an oversampling rate of four times the input.

Sampling of the input phase data in SDM 461 in this manner improves the in-band signal-to-noise ratio. SDM 461 has a 3rd Order Loop topology. As should be understood, however, other suitable circuit topologies may also be utilized for SDM 461 where desired.

The output of SDM 461 in the present embodiment is then combined with the integer portion of the channel number received from Channel Calculation component 457. Combiner 464 combines the fractional and integer portions of the channel number and provides the resultant output to Divider 465.

PLL 462 preferably modulates a wave signal synthesized by an RF carrier wave signal source, such as Reference Source 460 using the phase portion of the input signal. Reference Source 460 may be any source of electromagnetic waves that is capable of producing a carrier wave with a stable phase and frequency, such as a PLL. The appropriate clocking for the carrier wave is provided by Clock 444. However, it should be noted that external references sources can be utilized to provide a stable phase and frequency. The frequency of Reference Source 460 is compared with the output frequency of Carrier Wave Oscillator 466, divided by the series of numbers received by Divider 465 from SDM 461 and Channel Calculation component 457. In the present embodiment, it is desirable that the phase of the carrier wave not be shifted in relation to the phase data, as this may produce non-linearities in the modulated wave. Phase-Frequency Detector (PFD) 469 is used to compare the relative phases of the two signals and then outputs a signal that is proportional to the difference (phase shift) between them. This output signal is utilized, after passing through Low Pass Loop Filter 467, to adjust the frequency of Carrier Wave Oscillator 466, so that the phase difference measured at PFD 469 is substantially close. Hence, the phase of the signal is locked by the feedback loop to prevent unwanted drift of the signal phase, due to variations (i.e., distortion) in the phase and frequency of Carrier Wave Oscillators 466.

As described above, modulation may occur in Wideband Phase Modulator 450 by the phase component of the input signal by using phase modulation (PM), although other modulation schemes may also be used. The output of Wideband Phase Modulator 450 in the illustrated embodiment is thus an electromagnetic wave that has a substantially constant, and preferably, constant amplitude (or envelope) characteristic, but a frequency or phase characteristic that varies from its original constant value in relation to the phase component of the input signal.

The output is then sent via Variable Gain Attenuator/Amplifier (VGA) 470 to Variable Gain Amplifiers 420 where it is amplified. Other embodiments of this solution may include filtering components after component 450 to provide additional suppression of wideband noise. Other variations of this embodiment may replace component with a fixed gain and include multiple amplification stages for 420. Impedance matching components may be used here as well, to compensate for the varying impedances caused by the varying frequencies. Amplifier 475 is as was described above in FIG. 2.

Once the signal is output, and impedances matched if desired, Duplexers 476 and 477 provide switching among any receiver implementations and transmitters. The diplexers may be used to support multiple frequency bands of operation. Of course, in other embodiments the signal may then pass to a load. In the especially preferred embodiments, any load line is chosen, as is known in the art, to provide an impedance match for a load. It is important to note however that impedance matching is not necessary between Amplifier 475 and a load, as Amplifier 475 is serving as a current source rather than a power source. Of course, in other embodiments, the signal may undergo further alteration, amplification, modification and/or processing upon being placed on a load or other line leading away from Amplifier 475.

Embodiments may utilize both analog and digital components, where desired, insofar as these embodiments manipulate waves and signals requiring both. For example, cell phone embodiments may utilize both analog and digital components. Various types of system architectures may also be utilized for constructing the embodiments. For example, embodiments or various components may be provided on a semiconductor device where desired, such as an integrated circuit or an application-specific integrated circuit composition; some examples include silicon (Si), silicon germanium (SiGe) or gallium arsenide (GaAs) substrates. It must be noted that the components as described herein are not to be considered restrictedly. That is, due to the nature of digital signal processing, where building blocks may be used in various configurations, any component may be used in a number of functional configurations as desired.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A transmitter comprising:
    a first baseband processor comprising a pulse processing component for shaping the signal and a polar processing component for translating the signal into polar coordinates comprising amplitude and phase components;
    a wideband phase modulator; and,
    an amplitude modulated amplifier;
    a signal provider comprising a second baseband processor, which provides said signal for transmission to said first baseband processor and which provides signals for transmission and for providing power control signals to the amplitude modulated amplifier;
    wherein when a signal is provided from the signal provider through said first baseband processor for transmission, said signal is translated into polar coordinates, comprised of amplitude and phase components, with said amplitude component being transmitted to said amplitude modulated amplifier, comprised of one or more independently controllable current sources, and with said phase component being transmitted to said wideband phase modulator, for modulation upon a carrier wave and subsequent transmission to said amplitude modulated amplifier for amplification according to control imposed by said amplitude component upon said one or more current sources.

2. A transmitter according to claim 1, wherein said pulse processing component comprises at least one filter.

3. A transmitter according to claim 2, wherein said at least one filter comprises a plurality of FIR filters.

4. A transmitter according to claim 1, wherein said polar processing component translates the signal into polar coordinates comprising amplitude and phase components via a Coordinate Rotation Digital Computer CORDIC algorithm.

5. A transmitter according to claim 1 further comprising:
    an amplitude correction component;
    a synchronization adjustment component for maintaining synchronization of the amplitude component with the phase component of the signal;
    a segmentation component for converting the amplitude component of the signal into a plurality of digital pulses;
    a spectral shaping component for receiving the plurality of digital pulses from the segmentation component for spectral shaping; and
    a segment driver bank receiving the plurality of digital pulses from the spectral shaping component for amplification of the amplitude component of the signal.

6. A transmitter according to claim 1 further comprising:
    a phase correction component;

a do/dt component for translating data from the phase component into a derivative of a phase or frequency representation;

a data scaling processor for scaling the gain of the phase component;

an adaptive phase realignment component for calibrating said phase component;

a phase-frequency detector for modulating discrepancies identified in the calibration of the phase component;

a control logic and memory component for establishing a desired frequency; and a channel calculation component receiving the desired frequency from the control logic and memory component for determining a center frequency about which a given signal is to be modulated.

7. A transmitter according to claim 6, wherein the channel calculation component outputs a number that comprises an integer part and a fractional part, the fractional part passing through the data scaling processor for scaling gain; wherein the transmitter further comprises a combiner for receiving the fractional part from the data scaling processor and a phase signal output from the phase-frequency detector.

8. A transmitter according to claim 1, wherein the wideband phase modulator comprises:

a sigma delta modulator for generating phase component information;

a divider, receiving a feedback carrier signal and the phase component information from the sigma delta modulator, for dithering the divider between a range of divider values, to modulate the phase component information onto the feedback carrier signal;

a phase-frequency detector for receiving and comparing the modulated feedback carrier signal from the divider with a reference signal from a reference source to generate a comparison result;

a low-pass loop filter receiving the comparison result and generating a filtered output; and, a voltage control oscillator for generating a phase-modulated carrier wave in response to the filtered output from the low-pass loop filter, wherein the phase-modulated carrier wave further comprises the feedback carrier signal received by the divider.

9. A transmitter according to claim 1, wherein the wideband phase modulator comprises:

a sigma delta modulator receiving the phase component of the signal and generating a modulated phase component signal;

a combiner receiving the modulated phase component information from the sigma delta modulator and an integer portion generated by a channel calculation component, and generating a combined output signal;

a divider receiving the combined output signal for dithering the divider between a range of divider values, to modulate the combined output signal onto a feedback carrier signal;

a phase-frequency detector for receiving and comparing the relative phases of the modulated feedback carrier signal from the divider with a reference signal from a reference source to generate a comparison result;

a low-pass loop filter receiving the comparison result and generating a filtered output; and a carrier wave oscillator responsive to the filtered output for generating a phase-modulated carrier wave, wherein the phase-modulated carrier wave further comprises the feedback carrier signal received by the divider.

10. A transmitter according to claim 9, wherein the sigma delta modulator receives a fractional portion generated by the channel calculation component combined with the phase component of the signal.

11. A transmitter according to claim 1, further comprising a power control interface for providing one or more power control signals to said first baseband processor.

12. A transmitter according to claim 1, further comprising a power control interface for providing one or more power control signals to said wideband phase modulator.

13. A transmitter according to claim 1, further comprising a power control interface for providing one or more power control signals to said amplitude modulated amplifier.

14. A transmitter according to claim 1, further comprising a power management module for managing power within said transmitter.

15. A method of signal transmission comprising:

providing via a signal provider a signal for transmission to a first baseband processor, wherein said signal provider comprises a second baseband processor;

processing the signal through translation into polar coordinates, comprised of amplitude and phase components, via the first baseband processor;

transmitting said amplitude component to a amplitude modulated amplifier, comprised of one or more independently controllable current sources;

transmitting said phase component to a wideband phase modulator, for modulation upon a carrier wave, and, subsequent transmission to said amplitude modulated amplifier for amplification according to control imposed by said amplitude component upon said one or more current sources;

wherein said first baseband processor comprises a pulse processing component for shaping the signal; and, a polar processing component for translating the signal into polar coordinates comprising amplitude and phase components.

16. A method according to claim 15, wherein said pulse processing component comprises at least one filter.

17. A method according to claim 15, wherein said at least one filter comprises a plurality of FIR filters.

18. A method according to claim 15 wherein said processing a signal through translation into polar coordinates, comprised of amplitude and phase components, further comprises processing a signal through translation into polar coordinates, comprised of amplitude and phase components, through a CORDIC algorithm.

19. A method according to claim 15, wherein the step of processing said signal further comprises:

providing correction in the amplitude component of the signal;

maintaining synchronization of the amplitude component with the phase component of the signal;

converting the amplitude component of the signal into a plurality of digital pulses;

shaping of the plurality of digital pulses; and generating the plurality of digital pulses.

20. A method according to claim 15, wherein the step of processing said signal further comprises:

providing correction of the phase component;

translating data from the phase component into a derivative of a phase or frequency representation;

scaling the gain of the phase component;

calibrating said phase component;

modulating discrepancies identified in the calibration of the phase component;

establishing a desired frequency; and determining a center frequency about which a given signal is to be modulated in response to the desired frequency.

21. A method according to claim 15, wherein the step of processing the signal further comprises:
  generating phase component information;
  dithering a divider between a range of divider values, to modulate the phase component information onto a feedback carrier signal;
  comparing the modulated feedback carrier signal with a reference signal to generate a comparison result; and
  generating a phase-modulated carrier wave in response to the comparison result, wherein the phase-modulated carrier wave further comprises the feedback carrier signal.

22. A method according to claim 15, wherein the step of processing the signal further comprises:
  receiving the phase component of the signal and generating a modulated phase component signal;
  combining the modulated phase component information and an integer portion generated by a channel calculation component, and generating a combined output signal;
  receiving the combined output signal for dithering a divider between a range of divider values, to modulate the combined output signal onto a feedback carrier signal;
  comparing the relative phases of the modulated feedback carrier signal with a reference signal to generate a comparison result; and
  generating a phase-modulated carrier wave in response to the comparison result, wherein the phase-modulated carrier signal further comprises the feedback carrier signal.

23. A method according to claim 22, wherein the step of receiving the phase component of the signal and generating a modulated phase component signal further comprises receiving and combining a fractional portion generated by the channel calculation component with the phase component of the signal.

24. A method according to claim 15, further comprising providing one or more power control signals to said first baseband processor.

25. A method according to claim 15, further comprising providing one or more power control signals to said wideband phase modulator.

26. A method according to claim 15, further comprising providing one or more power control signals to said amplitude modulated amplifier.

27. A method according to claim 15, further comprising generating one or more power control signals to one or more segments of said amplitude modulated amplifier.

28. A method according to claim 15, further comprising managing power within said transmitter.

29. A transmitter comprising:
  a baseband processor;
  a wideband phase modulator; and,
  an amplitude modulated amplifier;
  wherein when a signal is provided through said baseband processor, said signal is translated into polar coordinates, comprised of amplitude and phase components, with said amplitude component being transmitted to said amplitude modulated amplifier, comprised of independently controllable current sources, and with said phase component being transmitted to said wideband phase modulator, for modulation upon a carrier wave and subsequent transmission to said amplitude modulated amplifier for amplification according to control imposed by said amplitude component upon said current sources, said baseband processor comprising:
  a pulse processing component comprising a plurality of FIR filters for shaping the signal; and,
  a polar processing component for translating the signal into polar coordinates comprising amplitude and phase components.

30. A method of signal transmission comprising:
  processing a signal through translation into polar coordinates, comprised of amplitude and phase components, via a baseband processor, said baseband processor comprising a pulse processing component comprising a plurality of FIR filters for shaping the signal and a polar processing component for translating the signal into polar coordinates comprising amplitude and phase components;
  transmitting said amplitude component to a amplitude modulated amplifier, comprised of independently controllable current sources;
  transmitting said phase component to a wideband phase modulator, for modulation upon a carrier wave, and, subsequent transmission to said amplitude modulated amplifier for amplification according to control imposed by said amplitude component upon said current sources.

* * * * *